United States Patent [19]
Lines

[11] Patent Number: 5,751,643
[45] Date of Patent: May 12, 1998

[54] DYNAMIC MEMORY WORD LINE DRIVER

[75] Inventor: Valerie L. Lines, Ottawa, Canada

[73] Assignee: Mosaid Technologies Incorporated, Ontario, Canada

[21] Appl. No.: 611,558

[22] Filed: Mar. 6, 1996

Related U.S. Application Data

[63] Continuation-in-part of Ser. No. 515,904, Aug. 16, 1995, which is a continuation of Ser. No. 205,776, Mar. 3, 1994, abandoned, which is a continuation of Ser. No. 31,898, Mar. 16, 1993, abandoned, which is a continuation of Ser. No. 680,746, Apr. 5, 1991, Pat. No. 5,214,602.

[30] Foreign Application Priority Data

Apr. 6, 1990 [GB] United Kingdom ............ 9007790
Apr. 5, 1991 [GB] United Kingdom ............ 9107165

[51] Int. Cl.$^6$ ........................................ G11C 7/00
[52] U.S. Cl. ........................ 365/189.11; 365/230.06; 365/226
[58] Field of Search .................. 365/189.11, 189.06, 365/226, 230.06, 156, 149

[56] References Cited

U.S. PATENT DOCUMENTS

| | | | |
|---|---|---|---|
| 4,189,782 | 2/1980 | Dingwall | 365/190 |
| 4,442,481 | 4/1984 | Brahmbhatt | 365/226 |
| 4,583,157 | 4/1986 | Kirsch et al. | 363/60 |
| 4,689,504 | 8/1987 | Raghunathan et al. | 365/226 |
| 4,692,638 | 9/1987 | Stiegler | 307/449 |
| 4,716,313 | 12/1987 | Hori et al. | 365/230.06 |
| 4,730,132 | 3/1988 | Watanabe et al. | 307/446 |
| 4,814,647 | 3/1989 | Tran | 365/226 |
| 4,857,763 | 8/1989 | Sakurai et al. | 307/443 |
| 4,878,201 | 10/1989 | Nakaizumi | 365/189.11 |
| 4,888,738 | 12/1989 | Wong et al. | 365/189.06 |
| 5,010,259 | 4/1991 | Inoue et al. | 307/482 |
| 5,031,149 | 7/1991 | Matsumoto et al. | 365/189.11 |
| 5,038,327 | 8/1991 | Akaogi | 365/230.06 |
| 5,150,325 | 9/1992 | Yanagisawa et al. | 365/177 |
| 5,347,488 | 9/1994 | Matsusbita | 365/189.11 |
| 5,351,217 | 9/1994 | Jeon | 365/230.06 |
| 5,377,156 | 12/1994 | Watanabe et al. | 365/227 |

FOREIGN PATENT DOCUMENTS 0 197 505 10/1986 European Pat. Off. .
59-213090 12/1984 Japan .

OTHER PUBLICATIONS

Kitsukawa, Goro et al., "An Experimental 1–Mbit BiCMOS DRAM," IEEE Journal of Solid–State Circuits, vol. SC–22, No. 5, Oct. 1987.

Ishihara et al., "256k CMOS Dynamic RAM With Static Column Mode of Cycle Time of 50 ns," Nikkei Electronics, Feb. 11, 1985, pp. 243–263.

*Primary Examiner*—A. Zarabian
*Attorney, Agent, or Firm*—Hamilton, Brook, Smith & Reynolds, P.C.

[57] ABSTRACT

A circuit which accurately controls the word line (pass transistor gate) driving voltage to a voltage which is both controlled and is not significantly greater than is needed to drive the word line. The elements of the present invention eliminate the need for a double-boot-strapping circuit, and ensure that no voltages exceed that necessary to fully turn on a memory cell access transistor. Accordingly, voltages in excess of that which would reduce reliability are avoided, and accurate driving voltages are obtained. A DRAM includes word lines, memory cells having enable inputs connected to the word lines, apparatus for receiving word line selecting signals at first logic levels $V_{ss}$ and $V_{dd}$, and for providing a select signal at levels $V_{ss}$ and $V_{dd}$, a high voltage supply source $V_{pp}$ which is higher in voltage than $V_{dd}$, a circuit for translating the select signals at levels $V_{ss}$ and $V_{dd}$ to levels $V_{ss}$ and $V_{pp}$ and for applying it directly to the word lines for application to the enable inputs whereby an above $V_{dd}$ voltage level on the word line is achieved without the use of double boot-strap circuits.

29 Claims, 11 Drawing Sheets

DYNAMIC MEMORY WORD LINE DRIVER

RELATED APPLICATIONS

This is a Continuation-in-Part of U.S. Ser. No. 08/515,904, filed Aug. 16, 1995, which is a Continuation of 08/205,776, filed Mar. 3, 1994, abandoned Oct. 4, 1995 which is a Continuation of 08/031,898, filed Mar. 16, 1993, abondoned Mar. 3, 1994 which is a Continuation of Ser. No. 07/680,746, filed Apr. 5, 1991, now U.S. Pat. No. 5,214,602, which claims priority to United Kingdom application 9007790.0, filed Apr. 6, 1990, and United Kingdom application 9107165, filed Apr. 5, 1991. All of the above-mentioned applications are incorporated herein by reference in their entirety.

FIELD OF THE INVENTION

This invention relates to CMOS dynamic random access memories (DRAMs), and particularly to word line drivers.

BACKGROUND

Dynamic random access memories are generally formed of a matrix of bit lines and word lines with memory cells located adjacent the intersections of the bit lines and word lines. The memory cells are enabled to provide their stored bits to the bit lines or to permit a write operation by signals carried on the word lines.

Each memory cell is typically formed of a bit storage capacitor connected to a reference voltage and through the source-drain circuit of an "access" field effect transistor to an associated bit line. The gate of the field effect transistor is connected to the word line. A logic signal carried by the word line enables the transistor, thus allowing charge to flow through the source-drain circuit of the transistor to the capacitor, or allowing charge stored on the capacitor to pass through the source-drain circuit of the access transistor to the bit line.

In order for the logic level $V_{dd}$ potential from the bit line to be stored on the capacitor, the word line must be driven to a voltage above $V_{dd}+V_{tn}$, where $V_{tn}$ is the threshold voltage of the access transistor including the effects of back bias.

During the early days of DRAM design, NMOS type FETs, that is, N-channel devices were used exclusively. In order to pass a $V_{dd}+V_{tn}$ level signal to the selected word line, the gate of the pass transistor had to be driven to at least $V_{dd}+2V_{tn}$. Furthermore, to allow sufficient drive to achieve a voltage greater than $V_{dd}+V_{tn}$ on the word line within a reasonable length of time in order to facilitate a relatively fast memory, the gate of the pass transistor is driven to a significantly higher voltage. In such devices, the word line driving signal utilized capacitors in a well-known double-boot strap circuit.

In the above circuit, the boot strapping voltage circuit is designed to exceed the voltage $V_{dd}+2V_{tn}$, in order to ensure that temperature, power supply, and process variations would even allow the pass transistor driving voltage to fall below $V_{dd}+2V_{tn}$.

However, it has been found that in small geometry VLSI memories, the high voltages provided by the boot-strap circuits can exceed the tolerable voltages in the memory, thus adversely affecting reliability.

SUMMARY OF THE INVENTION

The present invention is a circuit which accurately controls the word line (pass transistor gate) driving voltage to a voltage which is both controlled and is not significantly greater than is needed to drive the word line. The elements of the present invention eliminate the need for a double-boot-strapping circuit, and ensure that no voltages exceed that necessary to fully turn on a memory cell access transistor. Accordingly, voltages in excess of that which would reduce reliability are avoided, and accurate driving voltages are obtained.

A preferred random access memory in accordance with the present invention includes word lines and dynamic memory cells. Each memory cell comprises a charge storage capacitor for storing a $V_{dd}$ logic level through an access transistor, and the access transistor has an enable input connected to a word line. A high voltage supply provides a controlled high voltage $V_{pp}$ which is greater than $V_{dd}$. A word line driver circuit includes a level shifter with static latching. The driver circuit receives word line selection signals at $V_{dd}$ logic levels to drive and latch control signals at $V_{pp}$ logic levels. For each latch state, a control signal is pulled down to a low level through an N-channel transistor gated by a high $V_{dd}$ level signal as the other control signal is latched to a high $V_{pp}$ level through a P-channel pull-up transistor. The word line driver circuit applies the controlled high voltage from the high voltage supply directly to a selected word line.

By providing a voltage source which is maintained at a controlled voltage level, the use of a double bootstrap circuit which generates a high voltage only when required is avoided. The controlled voltage supply is able to provide a much more stable $V_{pp}$ reference voltage, so the circuit may be designed to a lower $V_{pp}$ level which avoids the risk of supplying a transistor damaging voltage. It is also significant that the control signal which applies the $V_{pp}$ level directly to the word line is set and reset in response to $V_{dd}$ level signals, so that boosted voltages can be avoided in the word line driver altogether. Also, by latching the control signal, floating high voltages are avoided. If a decoded signal only floats at the high $V_{pp}$ level, there is the risk of excessive leakage from the control node. The leakage could result in word lines being improperly enabled or disabled and thus render a DRAM chip defective. With a latch circuit, the control signal is pulled high or low to a static level despite any leakage from the control signal node.

Preferably, the word line driver includes a CMOS level shifter circuit which comprises cross-coupled field effect transistors to latch control signals and a level shifter driving circuit which comprises an N-channel pull-down transistor to drive each control signal to each state. The high voltage is preferably applied directly to the word line through a P-channel field effect transistor. A control signal is applied to the gate of a field effect transistor which is connected source-to-drain between the high voltage supply and the word line, and an N-channel field effect transistor is connected between the word line and ground. Alternatively, the latched control signal may be the word line signal, applied from the high voltage supply directly through a transistor of the latching circuit.

In a word line driver circuit comprising primary and secondary decoders, it is preferred that each decoder present a latched level-shifted control signal in accordance with the present invention.

The high voltage level should be at least, and preferably about, $V_{dd}$ plus a threshold voltage of the access transistor-to-memory cell and it must be less than a transistor damaging voltage.

It is preferred that an N-channel access transistor be enabled through a P-channel FET, but a P-channel access transistor may be enabled through an N-channel device. In either case, a high voltage power supply source $V_{xx}$, such as $V_{pp}$, supplies a voltage which results in a $V_{xx}$ voltage difference between logic levels which exceeds the $V_{dd}$ voltage difference between the $V_{dd}$ logic levels.

According to an embodiment of the invention, a dynamic random access memory (DRAM) is comprised of word lines, memory cells having enable inputs connected to the word lines, apparatus for receiving word line selecting signals at first logic levels $V_{ss}$ and $V_{dd}$, and for providing a select signal at levels $V_{ss}$ and $V_{dd}$, a high voltage supply source $V_{pp}$ which is higher in voltage than $V_{dd}$, a circuit for translating the select signals at levels $V_{ss}$ and $V_{dd}$ to levels $V_{ss}$ and $V_{pp}$ and for applying it directly to the word lines for application to the enable inputs whereby an above $V_{dd}$ voltage level word line is achieved without the use of double boot-strap circuits.

According to the preferred embodiment of the invention a dynamic random access memory (DRAM) is comprised of bit lines and word lines, memory cells connected to the bit lines and word lines, each memory cell being comprised of an access field effect transistor (FET) having its source-drain circuit connected between a bit line and a bit charge storage capacitor, the access field effect transistor having a gate connected to a corresponding word line; a high supply voltage source $V_{pp}$; a circuit for selecting the word line and a circuit having an input driven by the selecting apparatus for applying the $V_{pp}$ supply voltage directly to the word line.

BRIEF DESCRIPTION OF THE DRAWINGS

A better understanding of the invention will be obtained by reference to the detailed description below, in conjunction with the following drawings, in which.

DETAILED DESCRIPTION OF A PREFERRED EMBODIMENT

Figure 1:
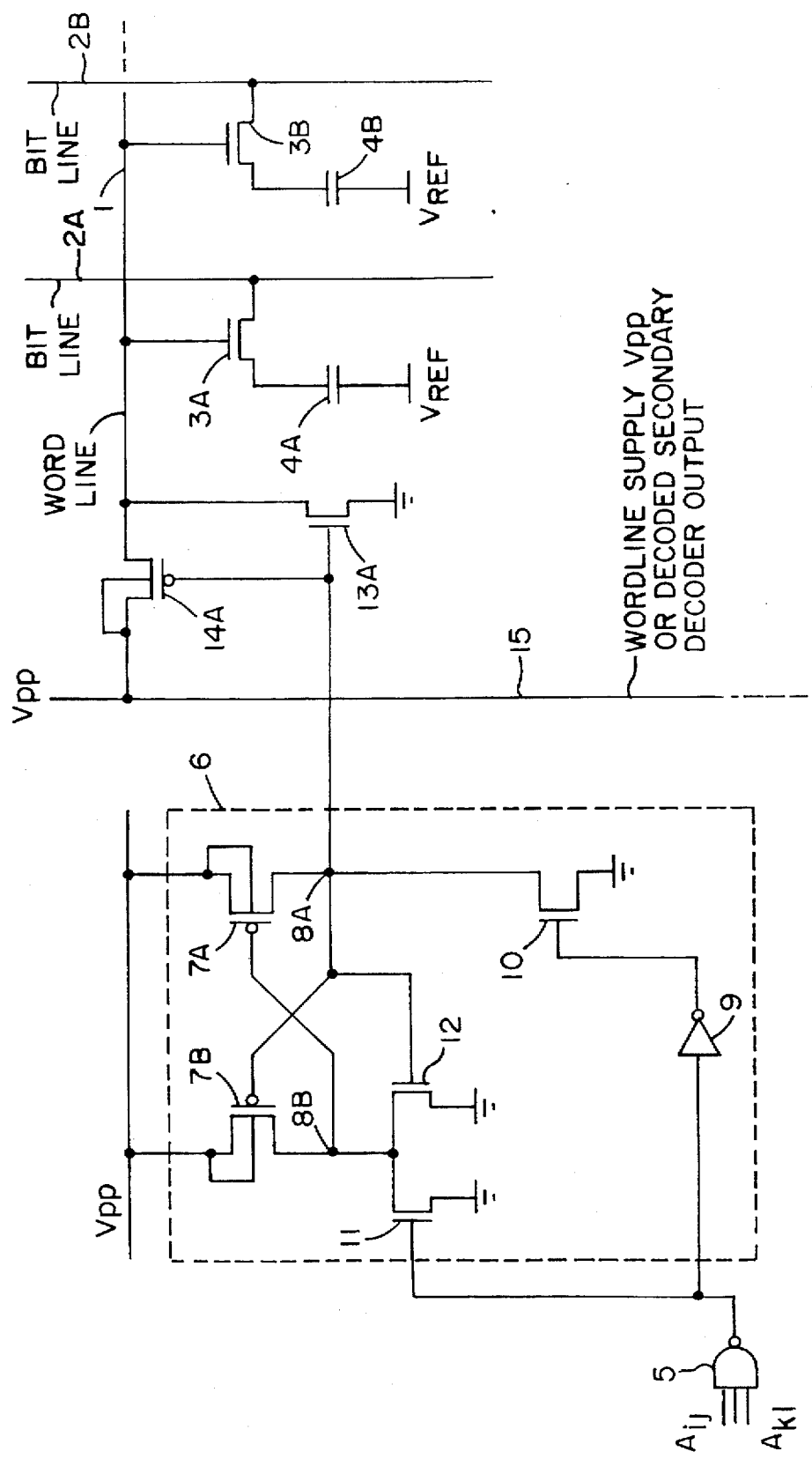
FIG. 1 is a schematic diagram of the invention.

Turning now to FIG. 1, a CMOS DRAM is comprised of word lines, represented by word line 1 and bit lines, represented by bit lines 2A, 2B, etc. Access transistors 3A, 3B have their gates connected to the word line; their sources are connected to bit charge storing capacitors 4A, 4B, etc. which are also connected to ground. The drains of access transistors 3A, 3B, etc. are connected to the bit lines 2A, 2B, etc. such that they are coupled as series pass transistors between bitlines and storage transistors.

With the application of a logic signal of $V_{dd}+V_{tn}$ to the gate of transistor 3A, 3B, etc., $V_{dd}$ level on the bit line 2A, 2B, etc. is fully transferred to the associated capacitor 4A, 4B, etc. during the writing cycle. In the prior art it was necessary to apply a voltage greater than $V_{dd}+2V_{tn}$ to the gate of an N-channel pass transistor in order to ensure that a voltage in excess of $V_{dd}+V_{tn}$ would be available at the gates of transistors 3A, 3B, etc.

The combination of a bit storing charge capacitor, e.g., 4A, with an associated access transistor, e.g., 3A, forms a memory cell in prior art DRAMs.

The word line is selected by means of addresses $A_{ij}$ applied to the inputs of a NAND gate 5 decoder. In the prior art a double boot-strap circuit was connected between the output of NAND gate 5 and the word line.

In accordance with the present invention a voltage $V_{pp}$ which is higher than the logic level $V_{dd}+V_{tn}$ is utilized. A level shifter 6 is formed of a pair of cross coupled P-channel transistors 7A and 7B which statically latch the level-shifted signals. The sources of transistors 7A and 7B are connected to the voltage source $V_{pp}$. The level shifter defines a first and a second control node, respectively 8A and 8B, which are latched, level-shifted, decoded signals.

The output of NAND gate 5 is connected through an inverter 9 to the gate of an N-channel FET 10. FET 10 has its source connected to ground and its drain connected to control node 8A.

The output of NAND gate 5 is connected to the gate of an N-channel FET 11, which has its source connected to ground and its drain connected to control node 8B. A third N-channel FET 12 has its source connected to ground, its drain connected to the drain of transistor 11, and its gate to control node 8A.

Control node 8A (or a buffered version of control node 8A) is applied to the gate of pass transistor 14A and pull-down transistor 13A. The source of pass transistor 14A is connected to $V_{pp}$ or to a secondary decoder output which provides a $V_{ss}$ or $V_{pp}$ level output; its drain to word line 1. The source of pull-down transistor 13A is connected to ground; the drain is connected to word line 1.

In operation, assume that the word line 1 has not been selected. At least one address input of NAND gate 5 is low, causing the output of NAND gate 5 to be high, and the output of inverter 9 to be low. Transistor 11 is enabled, pulling node 8B to ground. Transistor 10 is disabled, allowing transistor 7A to charge node 8A to $V_{pp}$. Transistor 12 is thus enabled ensuring that node 8A is pulled high. The $V_{pp}$ level node 8A disables the pass device 14A and enables pull-down transistor 13A so that word line 1 is held at ground. Thus transistors 3A and 3B are not enabled and are not conducting. The charge stored on capacitors 4A and 4B are thus maintained, and are not read to the bit lines.

Assume now that word line 1 is selected. Logic high level address signals at the voltage level $V_{dd}$ are applied to the inputs of NAND gate 5. The output of the NAND gate thus goes to low level. The output of inverter 9 changes to high level, transistor 10 is enabled, and pulls node 8A toward ground. This causes transistor 7B to be enabled, and pull node 8B toward $V_{pp}$. This causes transistor 7A to be disabled so that node 8A is pulled to ground, disabling transistor 12 and allowing transistor 7B to charge node 8B to $V_{pp}$. The ground level voltage on node 8A disables pull-down transistor 13A, and enables the pass transistor 14A so that the word line 1 is driven to a $V_{pp}$ level. The voltage on the word line is thus controlled, and depending on whether the word line is selected or not, it switches between ground and $V_{pp}$.

With the voltage $V_{pp}$ being controlled to $V_{dd}+V_{m}$, the voltage at the gates of the cell access transistors 3A and 3B is certain to be $V_{dd}+V_{t}$. However the voltage $V_{pp}$ is selected to be less than a voltage that would deteriorate reliability of the DRAM.

The circuit of FIG. 1 takes advantage of and overcomes disadvantages of known properties of MOSFETS. An N-channel device pulls low well but loses a threshold voltage at its output when high. On the other hand, a P-channel device pulls high well but leaves a threshold voltage on the output when the output is low. The CMOS configuration of transistors 7A and 10 assures the full swing of $V_{ss}$ to $V_{pp}$. Even so, it is important that the P-channel device 7A be turned fully off when the control signal 8A is low. Accordingly, the control signal 8B at its gate is driven to the $V_{pp}$ level by pull-up transistor 7B. Further, the low signal 8A pulled down by transistor 10 assures that pull-up transistor 7B is fully on. Similarly, when signal 8A is in the high state and the high signal on line 8A assures that transistor 7B is fully off, it is important that the signal 8B at the gate of transistor 7A be pulled low through pull-down transistors 11, 12. In summary, it is significant that the level shifter includes cross-coupled P-channel devices with the control signals 8A and 8B being driven low through N-channel pull-down transistors.

Figure 2A:
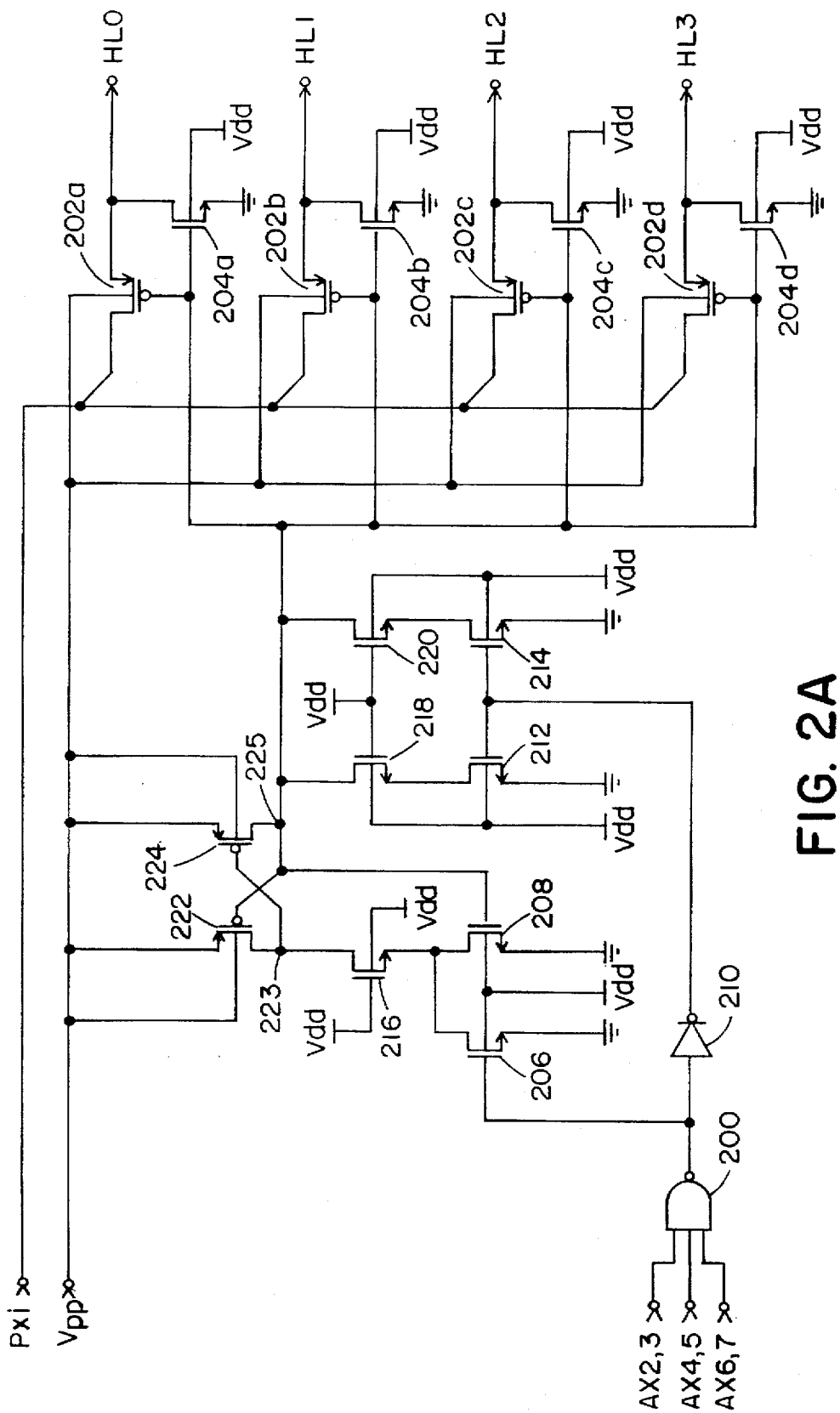
FIGS. 2A and 2B are a schematic diagram of a preferred embodiment of the invention.
Figure 2B:
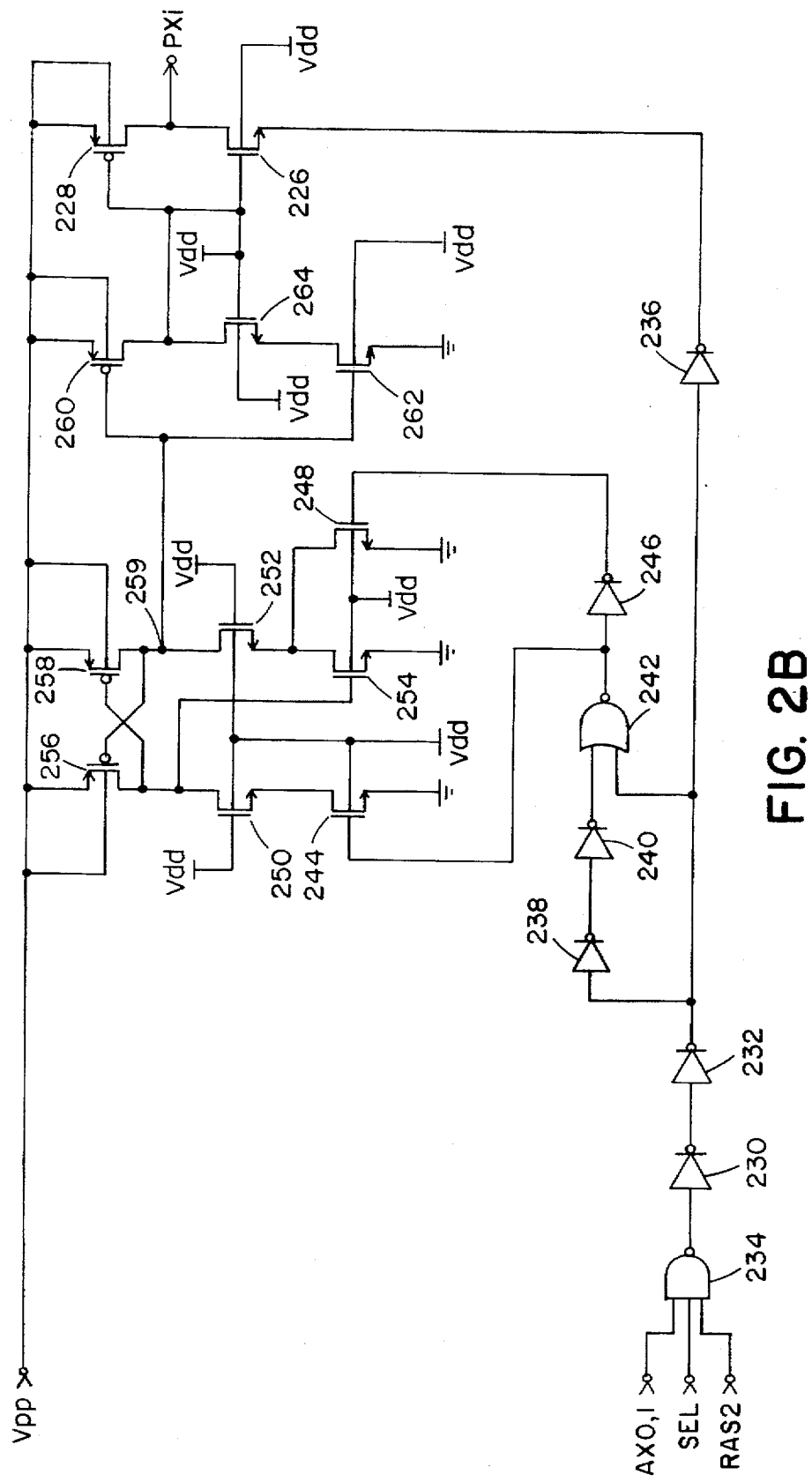

FIGS. 2A and 2B illustrate a preferred primary X-decoder and associated secondary X-decoder, respectively, embodying the invention.

Addresses AX2 through AX7 are used to select one of 64 X-decoders in an array. In unselected X-decoders the $V_{dd}$ level output of the NAND gate 200 is level shifted to $V_{pp}$ to ensure that the P-channel pass devices 202 remain disabled and the word line holdoff devices 204 are enabled. In the selected X-decoder, the gates of the four pass devices and word line holdoffs are pulled low, enabling the word line selected by the secondary X-decoder through one of the four PXi signals.

More specifically, the output of NAND gate 200 is applied to pull-down transistor 206 and, through an inverter 210, to pull-down transistors 212 and 214. Those pull-down transistors are protected by respective transistors 216, 218 and 220. The protection transistors are connected to the cross-coupled transistors 222 and 224 which provide static latching of level shifted control signals 223 and 225 as in the prior embodiment. A pull-down transistor 225, enabled by the control signal 225 at the output of the level shifter, is connected parallel to transistor 206.

As illustrated in FIG. 1, the $V_{pp}$ supply applied to the word line drive transistor 14A may be taken directly from the word line supply or be from a secondary decoder output. In the embodiment of FIGS. 2A and 2B, the $V_{pp}$ supply to transistor 202 is provided as the PXi output from the secondary decoder of FIG. 2B.

Addresses AX0 and AX1 are used to enable one of four secondary X-decoders in each subarray. Just after the addresses become valid and the pass device in the selected X-decoder is enabled, the selected secondary X-decode signal PXi, and thus the selected word line, rises to $V_{dd}-V_{m}$. After a short delay, the $V_{pp}$ pull-up 228 on PXi is enabled to charge the word line to $V_{pp}$. A two stage charge is used to minimize the charge taken from $V_{pp}$. At the end of the cycle, the RAS2 interlock quickly causes PXi to fall to $V_{ss}$ before the main X-decode is disabled. This causes the word line to start to be discharged through the N-channel device 226 in the secondary decoder. This minimizes the amount of work that the word line holdoff device 204 in the X-decoder must do and allows a protection device to be omitted there. Two extra buffering stages 230, 232 were added to the output of the NAND gate 234 in the secondary X-decoder to provide the necessary drive to the inverter 236 which drives the N-channel source in the PXi inverter while minimizing the load on AX0 and AX1.

More specifically, the output of buffer 232 is applied through inverters 238 and 240 and NOR gate 242 to the input of the level shifter circuit. The output of NOR gate 242 is applied to a pull-down transistor 244 and, through inverter 246 to pull-down transistor 248. Devices 244 and 248 are protected by devices 250 and 252. Pull-down transistor 254, in parallel with transistor 248, is driven from the input of the cross-coupled latch transistors 256 and 258. The latched, level-shifted control signal 259 at the output of the latch circuit is applied to an inverter comprising transistors 260 and 262, the latter being protected by transistor 264. The output of that inverter is then applied to the decoded output PXi which serves as a $V_{pp}$ supply to the primary decoder of FIG. 2A. Thus, the controlled $V_{pp}$ supply is applied directly to the word line WL through P-channel FETs 228 and 202.

From the above discussion, it can be seen that the normally high $V_{pp}$ signal on line 225 for driving the word lines low can be driven low through the decoder 200 and inverter 210 and the pull-down transistors 212 and 214. That low signal also turns transistor 222 on to latch a high $V_{pp}$ signal on line 222. The latch is reset when the address signals are disabled and the output of NAND gate 200 goes high. That high signal turns on pull-down transistor 206 which in turn turns on P-channel transistor 224 to drive the signal on line 225 to the high $V_{pp}$ level. It can also be noted that the only input signals to FIG. 2A which are not at $V_{dd}$ levels are the $V_{pp}$ supply and the signal PXi taken from the secondary decoder of FIG. 2B. But signal PXi is also derived from $V_{dd}$ level signals through a fully static, latched level shifter circuit similar to that of FIG. 2A. Thus, only $V_{dd}$ level signals drive the circuit to both set and reset the word lines, any $V_{pp}$ logic level signals themselves being obtained from $V_{dd}$ level signals through a statically latched level shifter. No bootstrapping is required.

Figure 3A:
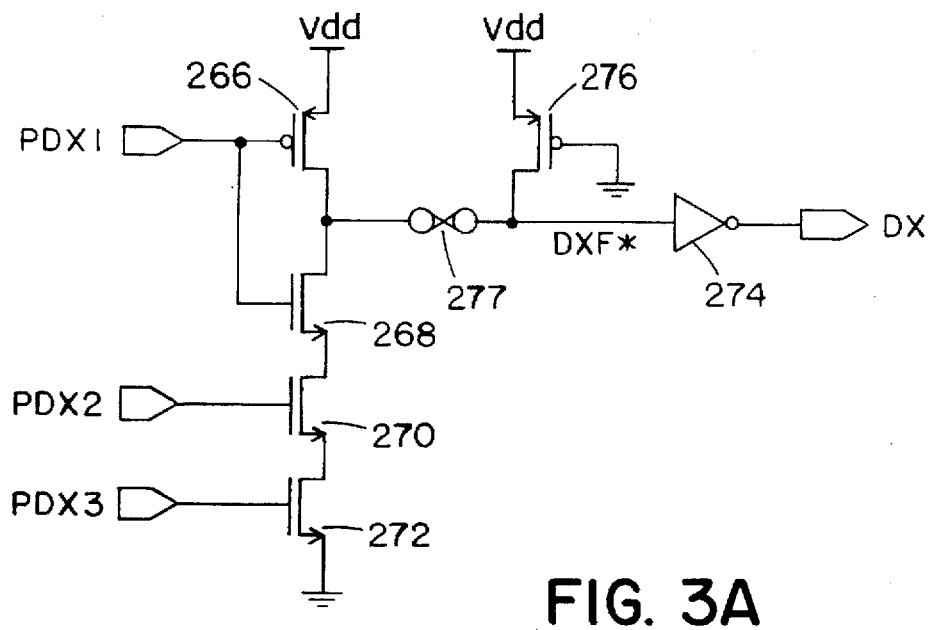
FIGS. 3A, 3B and 3C are a schematic diagram of another preferred embodiment of the invention.
Figure 3B:
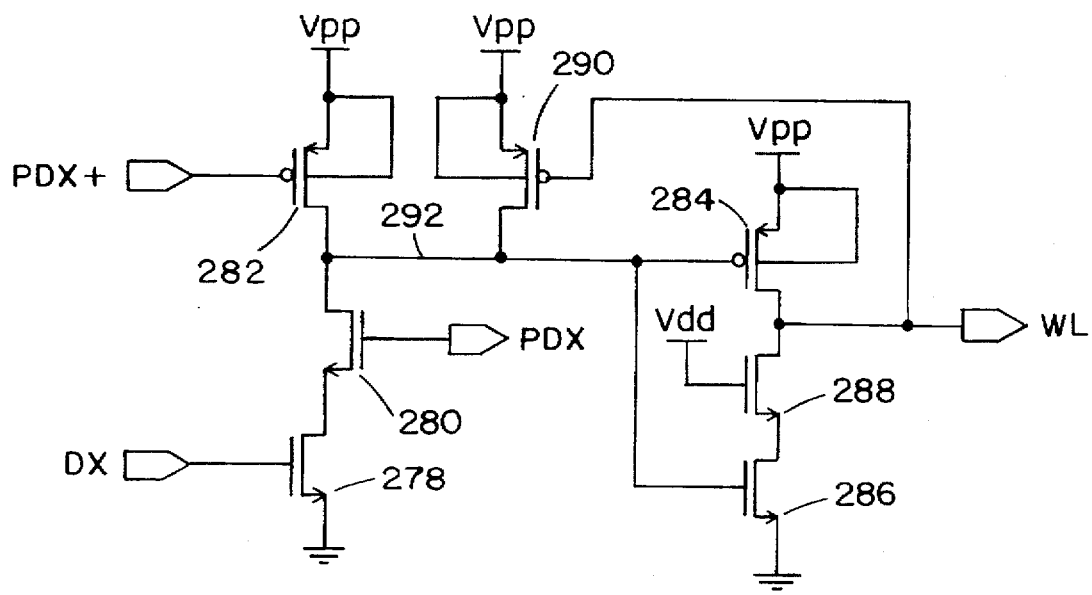
Figure 3C:
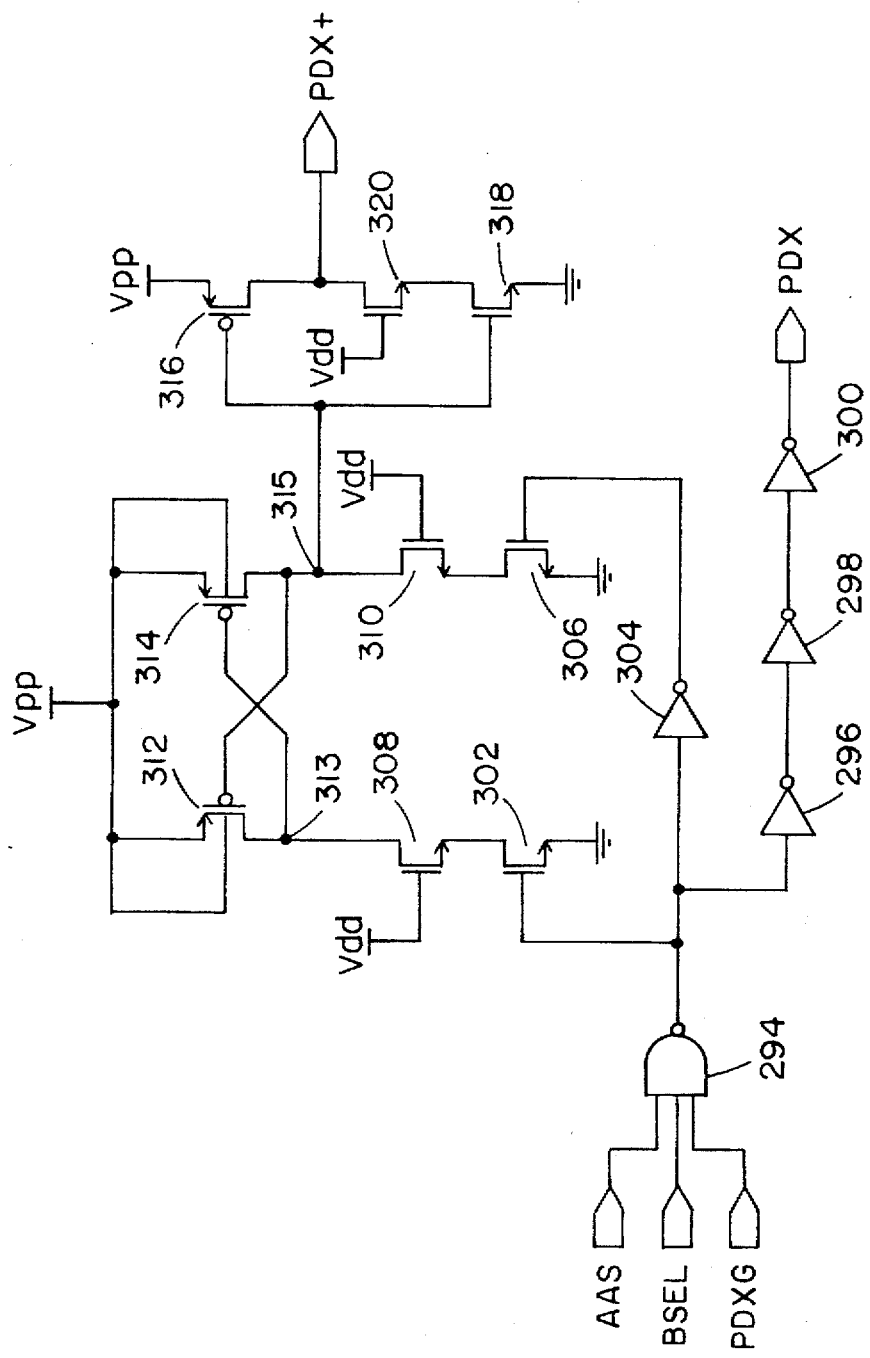

FIGS. 3A, 3B and 3C illustrate yet another preferred embodiment of the invention. The primary X-decoder is comprised of an AND gate shown in FIG. 3A and a level shifter and driving circuit shown in FIG. 3B. The AND gate is comprised of transistors 266, 268, 270 and 272 feeding a normal $V_{dd}$ inverter 274. A transistor 276 having its gate coupled to ground serves as a pull up on node DXF* to ensure that a decoder disabled by blowing the fuse 277 remains in the off state.

The output DX from the AND gate is applied to transistor 278 of a modified NAND gate in the word line driver output circuit of FIG. 3B. Also applied to the NAND gate is the $V_{dd}$ PDX and the $V_{pp}$ PDX+ decoded outputs from the secondary X-decoder. Those signals are applied to transistors 280 and 282, respectively. The output of that NAND gate is applied to an inverter comprising transistors 284 and 286 with protection device 288 to drive the word line WL. The word line is coupled back to the gate of transistor 290 to latch the control signal 292.

The secondary X-decoder of this embodiment is illustrated in FIG. 3C. The outputs of NAND gate 294 are applied through buffers 296, 298 and 300 to supply the $V_{dd}$ level PDX signal to the word line driver output circuit. The NAND gate output is also applied to pull-down transistor 302 and through inverter 304 to pull-down transistor 306. Protection devices 308 and 310 are also provided. Transistors 312 and 314 serve as the cross-coupled latched circuit which provides the control input to the $V_{pp}$ level PDX+ drive transistors 316 and 318. An additional protection device 320 is included in that circuit.

The word line signal WL is latched by the cross-coupled P-channel devices 284 and 290. It is set high by $V_{dd}$ level signals DX and PDX through pull-down transistors 278 and 280 and is reset when those devices are turned off as P-channel device 282 is turned on to turn pull-down transistor 286 on. The $V_{pp}$ level signal PDX+ in the circuit of FIG. 3B is derived through a separate fully static, latched level shifter circuit driven only by $V_{dd}$ level signals as illustrated in FIG. 3C. Again, no bootstrapping is required. In particular, control signals 313 and 315 are level shifted signals between pull-up transistors 312 and 314 and pull-down transistors 302 and 306.

Figure 4:
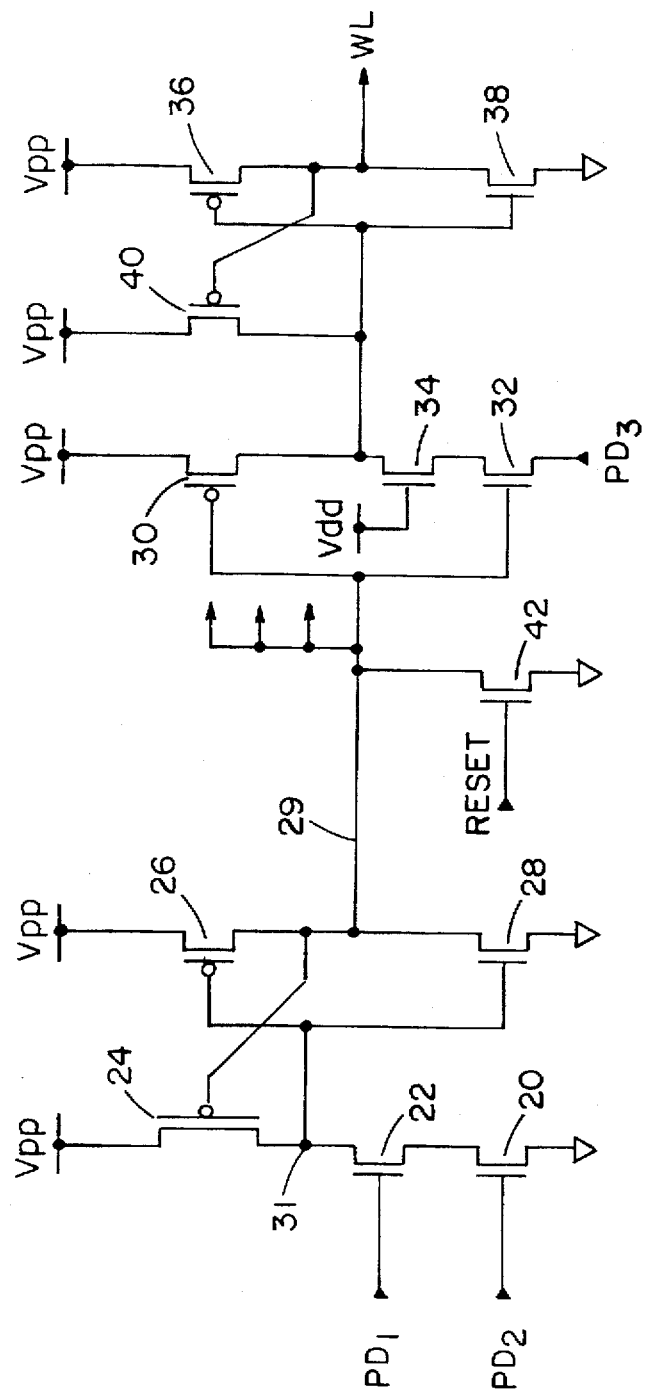
FIG. 4 illustrates a primary decoder stage having two latched level shifters, the word line being driven directly through a P-channel FET in the latching circuit of the second level shifter.

In the circuit of FIG. 4, predecoded address signals PD1 and PD2 from a selecting circuit are applied to level shifter driving FETs 20 and 21 at the input of the cross-coupled transistors 24 and 26 of a level shifter circuit. Parallel pull-down transistors 28 and 42 are also included in the level shifter driving circuit, the transistor 42 receiving an input from a selecting circuit. The output of the level shifter is applied through four output stages to respective word lines, only one of which is shown. A signal is applied to an inverter comprising CMOS transistors 30 and 32 with a breakdown protection transistor 34. The output of that inverter is applied to a final inverter comprising transistors 36 and 38. Transistor 40 is cross-coupled with transistor 36 to latch the inverter output.

The output stage is also controlled by a third predecoded signal PD3 which may be an address or control signal, preferably of $V_{dd}$ level. If a $V_{pp}$ level signal, PD3 would be obtained through a level shifter, preferably a latched level shifter. Prior to receiving the predecoded address signals PD1, PD2 and PD3, the circuit is reset by a reset signal applied to transistor 42 which pulls the control signal 29 low, thus resetting the level shifter latch circuit 24, 26 and the output stage latch circuit 36, 40. It can be seen from the above that the circuit of FIG. 4 receives the word line selection signals PD1 and PD2 and latches a control signal 29 at the high $V_{pp}$ level. Through the inverters of the output stage, the controlled $V_{pp}$ level is applied through transistor 36 to the word line.

Note that the $V_{pp}$ level signal on the word line is latched by transistors 36 and 40. That latch is set through pull-down transistor 32, the input of which is derived from $V_{dd}$ level signals PD1 and PD2 through the statically latched level shifter including transistors 24 and 26. The output latch is reset by application of a reset signal, which is preferably a $V_{dd}$ level signal, to pull-down transistor 42 to turn on pull-up transistor 30 and then pull-down transistor 38.

In this circuit, the level shifter including transistors 24 and 26 is reset by pulling control signal 29 low through pull-down transistor 42. That turns transistor 24 on to pull up control signal 31, which in turn turns pull-up transistor 26 off and pull-down transistor 28 on. Transistor 28 thereafter keeps control signal 29 low until the latch is set through pull-down transistors 20 and 22.

Figure 5:
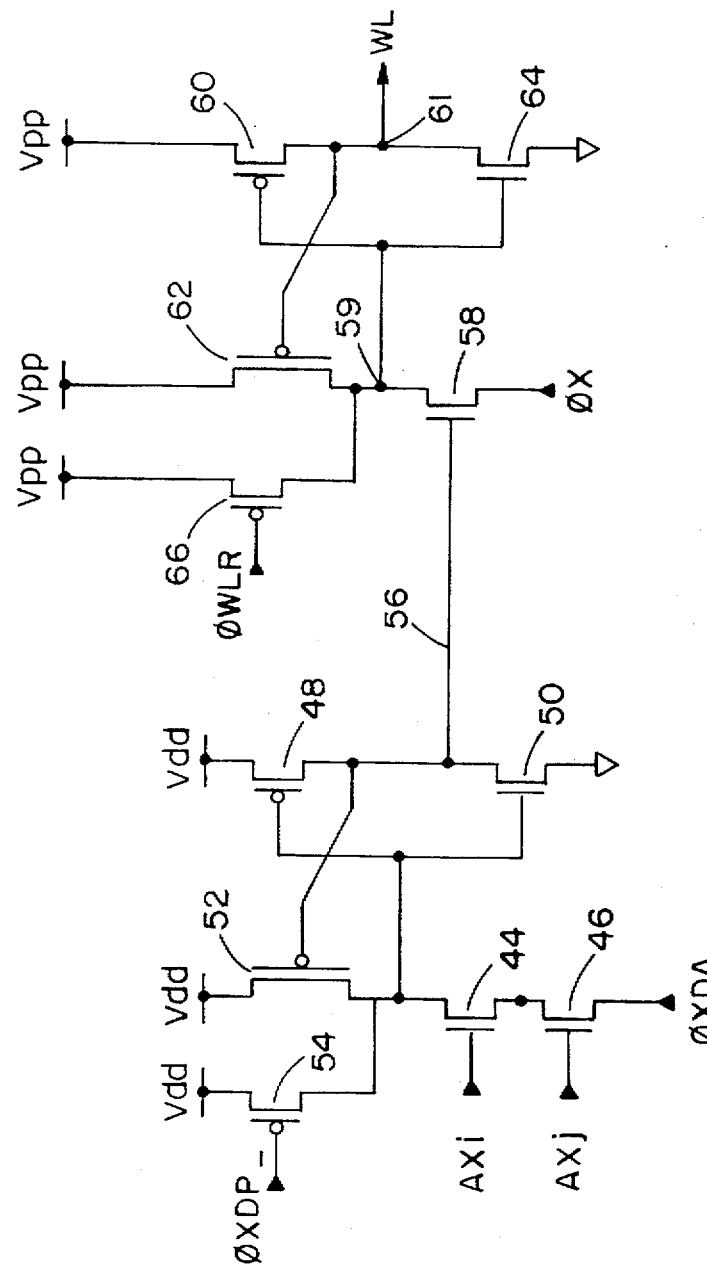
FIG. 5 shows an alternative embodiment in which the word line is driven directly by a P-channel FET which forms part of the level shifter latch circuit.

The circuit of FIG. 5 is similar to that of FIG. 4 except that the first decoding portion operates at $V_{dd}$ levels. The address signals AXi and AXj are applied to transistors 44 and 46 of a NAND gate which also receives a control signal ϕXDA. Signal OXDA may also include address information. The output from the NAND gate is applied to an inverter comprising CMOS transistors 48 and 50, transistor 48 being cross-coupled with transistor 52 to form a latch circuit. A precharging control signal ϕXDP is applied to a precharge transistor 54 to initially set the output of the NAND gate 44, 46 high and the output 56 of the latched inverter low. The signal 56 is applied to four output stages, only one of which is shown. A $V_{dd}$ or $V_{pp}$ logic signal ϕX is also applied to the output stage to provide another level of decoding. Transistor 58 inverts the signal 56 and level shifts it to a $V_{pp}$ logic level. The level shifter includes the cross-coupled transistors 60 and 62. Transistor 60 is coupled in series with an N-channel pull-down transistor 64. Transistor 66 allows for precharging of the level shifter to provide a low signal on the word line prior to control of the circuit from the address inputs. The logic signal ϕWLR should be a stable $V_{pp}$ level signal derived through a level shifting circuit. For example, it is preferably derived from a level shifter circuit as illustrated in FIG. 3C where the ϕWLR logic signal would replace the PDX+ logic output of FIG. 3C. Signals ϕWLR and ϕX may each include address and/or control information. ϕX may simply be ground.

In this circuit, control signals 59 and 61 are between respective pull-up transistors 62 and 60 and pull-down transistors 58 and 64. The signals are reset from a $V_{dd}$ level signal applied to the gate of a pull-down transistor in the level shifter which generates ϕWLR. The control signals are set through the $V_{dd}$ level signal 56 at the gate of pull-down transistor 58. They are reset by signal ϕWLR which is gated by a $V_{pp}$ level signal from FIG. 3C. In particular, reset is by pull-down transistor 302 pulling control signal 313 low which in turn pulls ϕWLR low through the latch and inverter circuits of FIG. 3C. In that way, signal 100 WLR is a stable level shifted signal.

Figure 6:
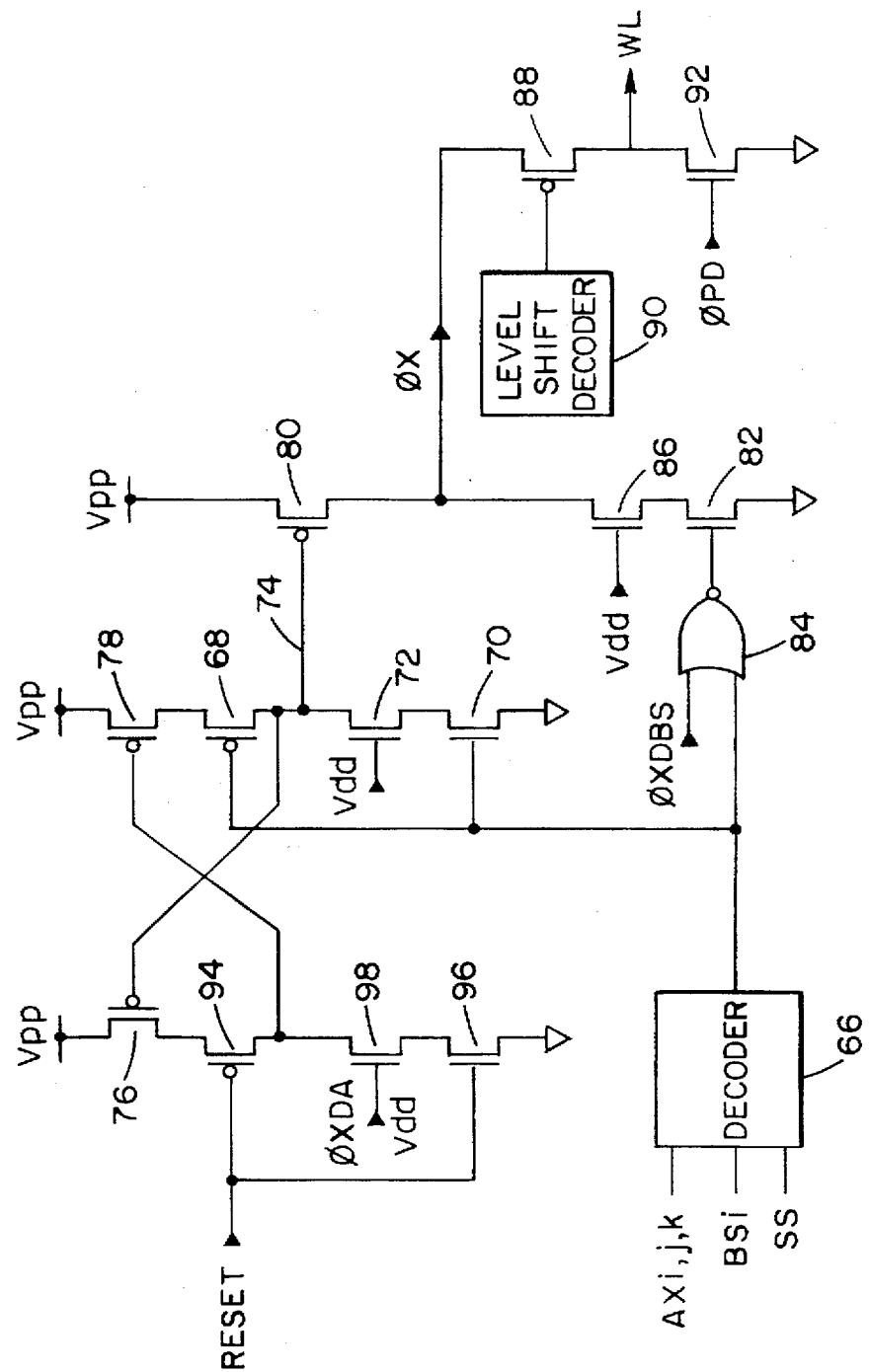
FIG. 6 illustrates an embodiment of the invention having primary and secondary decoder stages, each having a latched level shifting decoder.

In the circuit of FIG. 6, the address signals are decoded in decoding logic 66 and applied to a latched level shifter. The decoded address signal is applied to transistors 68 and 70 which have a protection transistor 72 in series therewith. The level shifted control signal 74 is latched by the cross-coupled transistors 76 and 78. The control signal 74 is applied to P-channel transistor 80 to drive one of plural decoded power supplies ϕX to word line driver output circuits, one of which is shown. A pull-down transistor 82 is driven by the level shifter input through a NOR gate 84 which includes the input ϕXDBS that allows pull-down transistor 82 to be disabled while address information is not present. A protection transistor 86 is included in series with transistor 82.

The high voltage level signal ϕX is gated to the word line through a P-channel transistor 88 which is driven by a primary level shift and decode circuit 90. A pull-down transistor 92 is driven by a word line pull down signal ϕPD. To reset the latched level shifter, a reset signal is applied to CMOS transistors 94 and 96 having a protection transistor 98 in series therewith.

Figure 7:
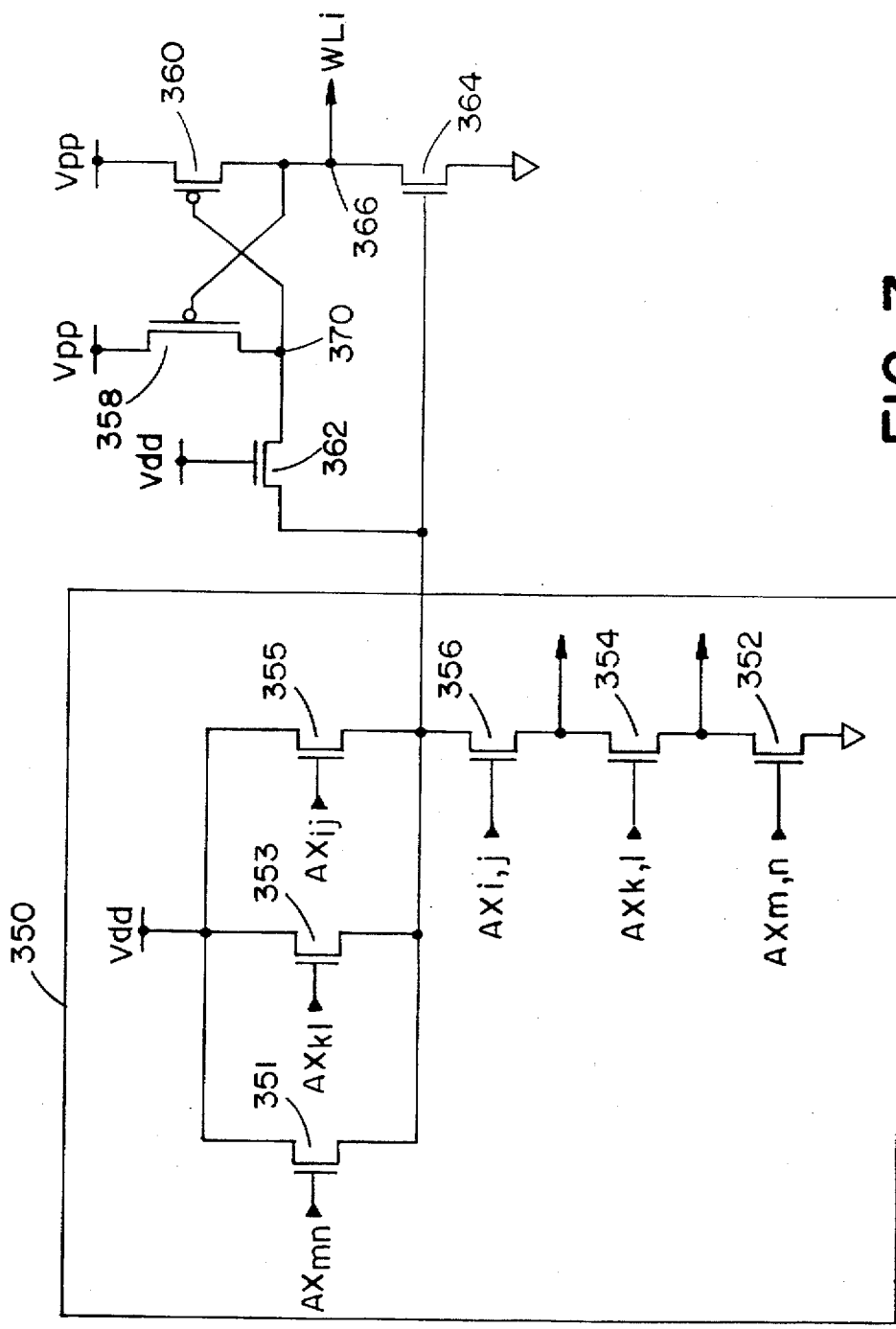
FIG. 7 illustrates yet another primary decoder embodying the invention.

FIG. 7 illustrates yet another embodiment of the invention. In this embodiment, transistors 351 to 356 serve as a NAND gate decoding circuit 350 which provides inputs to the latch circuit 358 and 360 through a protection transistor 362 and an inverting transistor 364. In this case, the latched, level-shifted decoded control signal 366 is on the word line WLi such that the word line is driven directly from the $V_{pp}$ supply through transistor 360 of the latch circuit.

In the circuit of FIG. 7, transistor 364 provides the pull-down to control signal 366, and the transistors 352, 354 and 356 of the NAND gate provide the pull-down to control signal 370. The signal on the word line is fully latched by cross-coupled P-channel transistors 358 and 360. CMOS NAND gate 350 assures that device 364 is driven by full $V_{dd}$ level voltage swings. It is significant that the protection transistor 362 is not coupled as a pass transistor between the NAND gate and the gate of transistor 364. In that case, the pass transistor would cause a threshold voltage drop from $V_{dd}$ at the output of the NAND gate to the gate of transistor 364. Since the gate voltage required to turn on transistor 364 is at least a threshold voltage, the $V_{dd}$ level would necessarily be at least two threshold voltages and low voltage operation would be precluded.

It can be seen from each of the above embodiments of the invention, that a controlled $V_{pp}$ level signal is applied directly through one or more field effect transistors to a word line. Further, each P channel FET which passes a $V_{pp}$ signal is gated by a $V_{pp}$ level logic signal. All logic signals are at either $V_{dd}$ levels or $V_{pp}$ levels. Transitions from $V_{dd}$ to $V_{pp}$ levels are obtained through level shifting circuits powered by the controlled $V_{pp}$ supply. Preferably, the level shifting circuits include cross coupled P-channel devices to latch the $V_{pp}$ level signals and are driven by N-channel pull-down devices for driving the $V_{pp}$ level signals in both setting and resetting the latches. The above circuits completely avoid the uncertain and perhaps damaging voltage levels obtained through unregulated boost circuits.

Figure 8A:
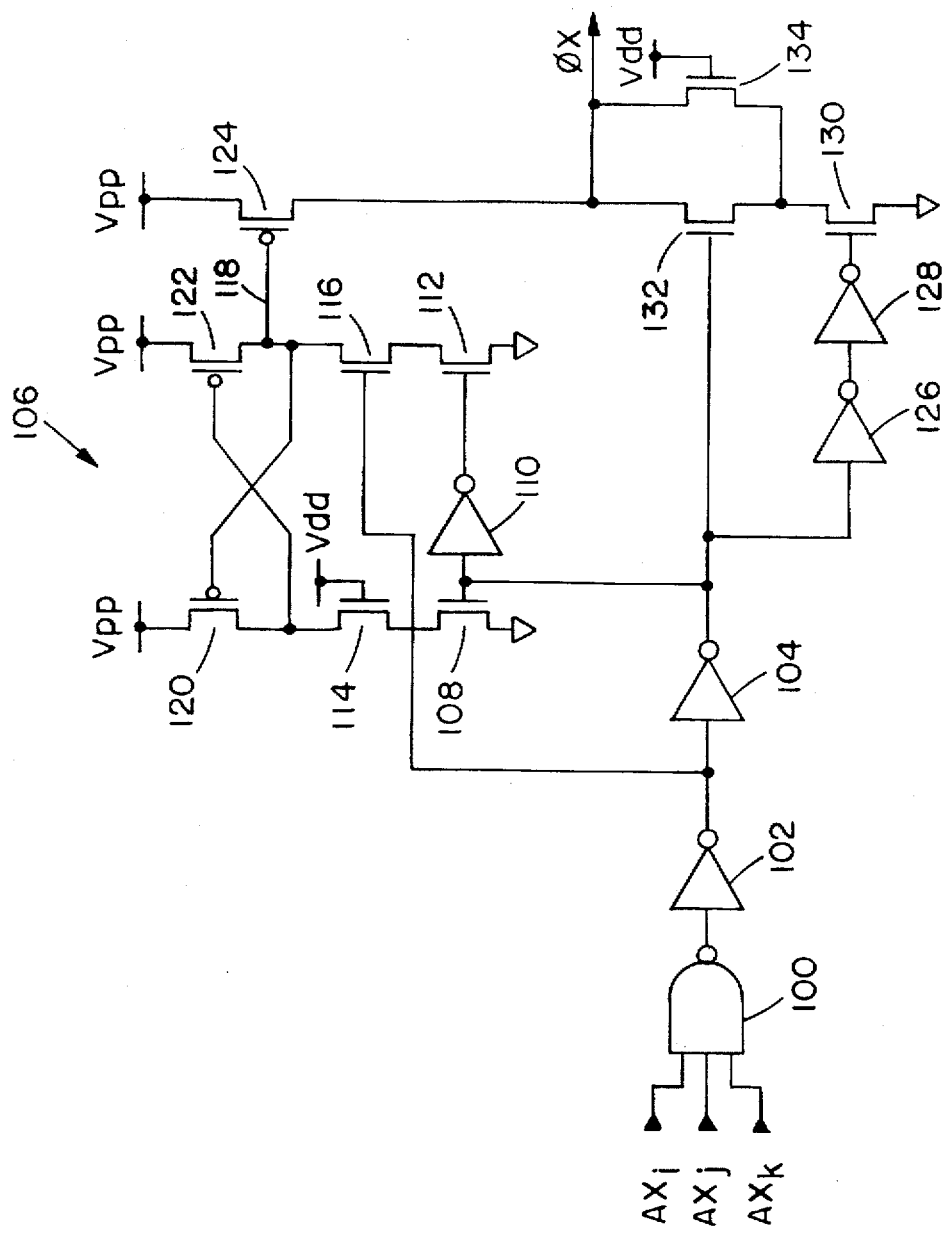
FIGS. 8A and 8B illustrate a less preferred embodiment of the invention.
Figure 8B:
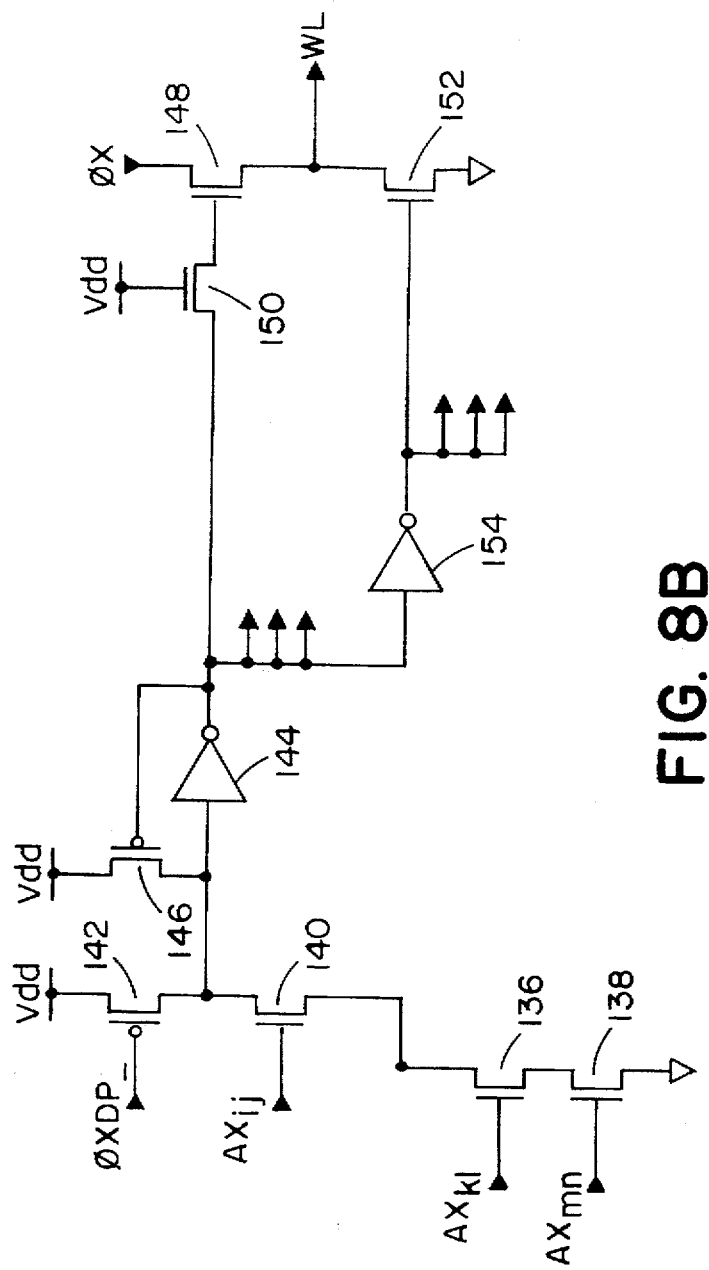

FIGS. 8A and 8B illustrate another word line driver in which the circuit of FIG. 8A is a secondary row decoder and the circuit of FIG. 8B is a primary row decoder. The first stage of the primary decoder of FIG. 8B drives four output stages, only one of which is shown. Each of those output stages is powered by a different high voltage signal $\phi X$ derived from the secondary row decoder.

As shown in FIG. 8A, the address signals AX are applied to a NAND gate 100, inverted at 102 and 104 and applied to a latched level shifter 106. The output of inverter 104 is applied to a pull-down transistor 108 and, through an inverter 110, to a pull-down transistor 122. Transistors 114 and 116 serve as protection devices. A level shifted control signal 118 is latched by cross-coupled transistors 120 and 122. The control signal 118 is applied to a P-channel transistor 124 to drive the high $V_{pp}$ voltage source directly to the selected $\phi X$ line.

The output from inverter 104 is also applied through a pair of inverters 126 and 128 to a pull-down transistor 130, the inverters 126 and 128 providing a delay. Protection for transistor 130 is provided by transistors 132 and 134.

The primary row decoder of FIG. 8B selects four word lines, only one of which is powered by a selected $\phi X$ voltage supply. The primary decoder of this embodiment operates at $V_{dd}$ levels. Transistors 136, 138 and 140 serve as a three-input NAND gate. The output of that NAND gate is precharged by a transistor 142 and that precharge is retained by a latched circuit comprising an inverter 144 and feedback transistor 146. $V_{dd}$ levels may be applied to the transistors 142, 146 and 150 as shown, and to inverters 144 and 154, or $V_{pp}$ levels may be applied. When the address signals are asserted, transistors 136, 138 and 140 pull the input to inverter 144 low, and its output goes high to precharge the gate of transistor 148 to $(V_{dd}-V_{tn})$ or $(V_{pp}-V_{tn})$ through pass transistor 150. If $V_{pp}$ is applied, then charging the gate to $(V_{pp}-V_{tn})$ allows operation at lower voltages. Subsequently, when $\phi X$ is driven to the high $V_{pp}$ voltage level by the secondary decoder circuit, the gate on transistor 148 goes to a level higher than $V_{pp}$ by capacitive coupling through the gate capacitance of device 148. That higher level is sufficient to assure that the $V_{pp}$ level passes through the N-channel transistor 148 to the word line WL. Thus, this output stage relies on a self-bootstrapped N-channel device 148. A pull-down N-channel transistor 152 is driven through an inverter 154.

Though the primary row decoder of FIG. 8B uses a self-bootstrapped transistor 148 to assure that the full $V_{pp}$ is applied to the word line, instead of a latched level shifter, and thus does not meet the full potential of applying the present invention to both decoders, it does at least rely on the latched level shifter in the secondary decoder to supply the high voltage supply $\phi X$. Thus, the voltage applied to the word line is still a controlled voltage with a well-defined constant output and not the unreliable output of a double bootstrap circuit of the prior art.

A person understanding this invention may now conceive of alternative structures and embodiments or variations of the above. All of those which fall within the scope of the claims appended hereto are considered to be part of the present invention.

For example, although it is preferred that an N-channel access transistor be driven by a P-channel FET, a P-channel access transistor may be used. In that case, the high voltage logic levels would not be ground and a voltage higher than $V_{dd}$ but would be a level below ground and $V_{dd}$. In each case, however, the voltage difference between the low and high levels would be greater with the high voltage logic levels.

What is claimed is:

1. A random access memory comprising:
   word lines;
   dynamic memory cells, each comprising a charge storage capacitor for storing a $V_{dd}$ logic level through an access transistor, the access transistors having enable inputs connected to the word lines;
   a high voltage supply which supplies a controlled high voltage $V_{pp}$ greater than $V_{dd}$; and
   a word line driver circuit, including a level shifter with latching, which receives word line selection signals at $V_{dd}$ logic levels to drive and latch first and second word line control signals at $V_{pp}$ logic levels, each control signal in a respective latch state being pulled down to a low level through an N-channel transistor as the other control signal is latched high through a P-channel pull-up transistor, the control signals being set and reset by pull-down transistors gated only by $V_{dd}$ level signals, the word line driver circuit applying the controlled high voltage from the high voltage supply to a word line.

2. A random access memory as claimed in claim 1 wherein the word line driver circuit comprises cross-coupled field effect transistors to latch the control signals.

3. A random access memory as claimed in claim 2 wherein the high voltage is applied directly to the word line through a P-channel field effect transistor.

4. A random access memory as claimed in claim 2 wherein one of the control signals is applied to the gate of a field effect transistor which is connected source-to-drain between the high voltage supply and the word line.

5. A random access memory as claimed in claim 4 wherein the field effect transistor connected between the high voltage supply and the word line is a P-channel field effect transistor.

6. A random access memory as claimed in claim 5 further comprising an N-channel field effect transistor connected between the word line and ground.

7. A random access memory as claimed in claim 6 wherein the word line driver circuit is a CMOS circuit.

8. A random access memory as claimed in claim 1 wherein the high voltage is applied directly to the word line through a P-channel field effect transistor.

9. A random access memory as claimed in claim 1 wherein the high voltage level is about $V_{dd}$ plus a threshold voltage of the access transistor in the memory cell.

10. A random access memory as claimed in claim 9 wherein the high voltage is applied directly to the word line through a P-channel field effect transistor.

11. A random access memory as claimed in claim 1 wherein the high voltage is at least $V_{dd}$ plus a threshold voltage of the access transistor in the memory cell and is less than a transistor damaging voltage.

12. A random access memory as claimed in claim 11 wherein the high voltage is applied directly to the word line through a P-channel field effect transistor.

13. A random access memory as claimed in claim 1 wherein the pull-down transistors which set and reset maintain the control signals in set and reset states.

14. A random access memory comprising:
word lines;
dynamic memory cells, each comprising a charge storage capacitor for storing a $V_{dd}$ logic level through an access transistor, the access transistors having enable inputs connected to the word lines;
a voltage supply which supplies a controlled voltage $V_{xx}$ having a $V_{xx}$ voltage difference between logic levels which exceeds a $V_{dd}$ voltage difference between the $V_{dd}$ logic levels; and
a word line driver circuit, including a level shifter with latching, which receives word line selection signals at $V_{dd}$ logic levels to drive and latch a control signal at $V_{xx}$ logic levels, the level shifter comprising a pair of cross-coupled transistors forming a latch driven by a pair of reset transistors complementary to the cross-coupled transistors, the reset transistor being gated only by $V_{dd}$ level signals, the word line driver circuit applying the control voltage from the voltage supply directly to a selected word line.

15. A method of selecting a word line in a dynamic random access memory comprising:
decoding address signals to drive first and second level shifted control signals to logic levels including a voltage level greater than the voltage to be stored in a memory cell and latching the level-shifted control signals, each control signal in a respective latch state being pulled down to a low level through an N-channel transistor as the other control signal is latched high through a P-channel pull-up transistor, the control signal being set and reset by pull-down transistors gated only by $V_{dd}$ level signals; and
from one of the latched, level-shifted control signals applying a controlled high voltage greater than the stored voltage to a selected word line.

16. A method as claimed in claim 15 wherein the level shifted decoded signals are latched by cross-coupled field effect transistors.

17. A method as claimed in claim 16 wherein the high voltage is applied directly to the word line through a P-channel field effect transistor.

18. A method as claimed in claim 16 wherein the latched, level-shifted decoded signal is applied to the gate of a field effect transistor which is connected source-to-drain between the high voltage supply and the word line.

19. A method as claimed in claim 18 wherein the field effect transistor connected between the high voltage supply and the word line is a P-channel field effect transistor.

20. A method as claimed in claim 19 wherein nonselected word lines are pulled to ground through N-channel field effect transistors.

21. A method as claimed in claim 18 wherein decoded signals are level shifted and latched in a CMOS circuit.

22. A method as claimed in claim 15 wherein the high voltage is applied directly to the word line through a P-channel field effect transistor.

23. A method as claimed in claim 15 wherein the high voltage is at least $V_{dd}$ plus a threshold voltage of the access transistor in the memory cell and is less than a transistor damaging voltage.

24. A method as claimed in claim 23 wherein the high voltage is applied directly to the word line through a P-channel field effect transistor.

25. A method as claimed in claim 15 wherein the high voltage is at least $V_{dd}$ plus a threshold voltage of the access transistor in the memory cell and is less than a transistor damaging voltage.

26. A method as claimed in claim 25 wherein the high voltage is applied directly to the word line through a P-channel field effect transistor.

27. A method as claimed in claim 15 wherein the pull-down transistors which set and reset maintain the control signals in set and reset states.

28. A method of selecting a word line in a dynamic random access memory comprising:
decoding address signals to drive level shifted control signals to logic levels having a voltage difference which is greater than the voltage difference between logic levels to be stored in a memory cell and latching the level shifted control signals by latching transistors, the latching transistors being set by reset transistors which are complementary to the latching transistors and gated only by $V_{dd}$ level signals; and from the latched, level-shifted control signals, applying a controlled voltage to the selected word line.

29. A dynamic random access memory (DRAM) comprising:
bitlines and word lines and memory cells connected to the bitlines and word lines, each memory cell being comprised of an access field effect transistor (FET) having its source-drain circuit connected between a bitline and a high logic level voltage $V_{dd}$ bit charge storage capacitor, the field effect transistor having a gate connected to a corresponding word line;
a high $V_{pp}$ supply voltage source which is in excess of the high logic level voltage $V_{dd}$ plus one transistor threshold voltage but less than a transistor damaging voltage;
means for receiving only $V_{dd}$ level logic inputs for selecting the word line and means having an input driven by the selecting means for applying the $V_{pp}$ supply voltage level directly to the word line through the source-drain circuit of an FET;
the means for applying comprising a level shifter connected to said high supply voltage source and comprising a pair of cross-coupled P-channel FET circuits connected between the high $V_{pp}$ supply voltage source and a pair of control nodes; and
level shifter driving means connected between the level shifter and ground and connected to the output of the selecting means, the level shifter driving means comprising a pair of N-channel FET circuits, each having source-drain circuits connected between a corresponding one of said control nodes and ground.

* * * * *

Disclaimer

5,751,643 — Valerie L. Lines, Ottawa, Canada. DYNAMIC MEMORY WORD LINE DRIVER. Patent dated May 12, 1998, Disclaimer filed Mar. 12, 2004, by the assignee, MOSAID Technologies, Incorporated.

The term of this patent shall not extend beyond the expiration date of Pat. No. 5,214,602

*(Official Gazette, August 10, 2004)*